(12) United States Patent
Kim et al.

(10) Patent No.: US 7,831,116 B2
(45) Date of Patent: Nov. 9, 2010

(54) OPTICAL WAVEGUIDE AND OPTICAL PRINTED CIRCUIT BOARD HAVING THE SAME

(75) Inventors: Joon-Sung Kim, Suwon-si (KR); Jae-Hyun Jung, Ansan-si (KR); Han-Seo Cho, Daejeon (KR); Sang-Hoon Kim, Gunpo-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 211 days.

(21) Appl. No.: 12/232,899

(22) Filed: Sep. 25, 2008

(65) Prior Publication Data

US 2009/0304324 A1    Dec. 10, 2009

(30) Foreign Application Priority Data

Jun. 9, 2008    (KR) .................. 10-2008-0053680

(51) Int. Cl.
*G02B 6/12* (2006.01)
*H01L 21/00* (2006.01)

(52) U.S. Cl. ............ 385/14; 385/15; 385/31; 385/32; 385/33; 385/131; 438/24; 438/31; 438/57

(58) Field of Classification Search ............ 385/14–15, 385/31–33, 131; 438/24, 31, 57
See application file for complete search history.

(56) References Cited

U.S. PATENT DOCUMENTS

| | | | |
|---|---|---|---|
| 6,706,546 B2 * | 3/2004 | Inao et al. ............ | 438/31 |
| 6,885,788 B2 * | 4/2005 | Iwaki et al. ............ | 385/15 |
| 7,203,388 B2 * | 4/2007 | Ha et al. ............ | 385/14 |
| 7,280,716 B2 * | 10/2007 | Ha et al. ............ | 385/14 |
| 7,340,121 B2 * | 3/2008 | Yonekura et al. ........ | 385/14 |
| 7,529,439 B2 * | 5/2009 | Kim et al. ............ | 385/14 |

FOREIGN PATENT DOCUMENTS

| | | |
|---|---|---|
| JP | 2003-215368 | 7/2003 |
| JP | 2008-207792 | 1/2008 |

OTHER PUBLICATIONS

Korean Office Action issued on Oct. 30, 2009 in corresponding Korean Patent Application 10-2008-0053680.

* cited by examiner

*Primary Examiner*—Brian M. Healy
*Assistant Examiner*—Guy G Anderson

(57) ABSTRACT

An optical waveguide, an optical printed circuit board equipped with the optical waveguide, and methods of manufacturing the optical waveguide and the optical printed circuit board are disclosed. The optical waveguide can include: a first cladding layer; a core formed on the first cladding layer; an alignment pattern, having a predefined positional relationship to the core, formed on the first cladding layer; a target mark formed on the alignment pattern to indicate a position of the alignment pattern; and a second cladding layer formed on the first cladding layer to cover the core, the alignment pattern, and the target mark. In such an optical waveguide, circuit patterns, etc., formed over the second cladding layer may be precisely and efficiently aligned with the core.

22 Claims, 18 Drawing Sheets

OPTICAL WAVEGUIDE AND OPTICAL PRINTED CIRCUIT BOARD HAVING THE SAME

CROSS-REFERENCE TO RELATED APPLICATIONS

This application claims the benefit of Korean Patent Application No. 10-2008-0053680 filed with the Korean Intellectual Property Office on Jun. 9, 2008, the disclosure of which is incorporated herein by reference in its entirety.

BACKGROUND

1. Technical Field

The present invention relates to an optical waveguide, an optical printed circuit board equipped with the optical waveguide, and methods of manufacturing the optical waveguide and the optical printed circuit board.

2. Description of the Related Art

With recent advances in computer and communication technology, the transfer rate of signals in electronic equipment has become an important parameter. However, in the case of a regular printed circuit board, a conductive metal such as copper, etc., may be used for the electrical wiring as the medium for signal transfer, and there may be limits to transmitting high capacities of data at high speeds. As a way to overcome such limits, the optical printed circuit board has been developed, in which an optical waveguide may be embedded in the printed circuit board.

Here, an optical waveguide may be composed of a center portion having a high refractive index, known as the core, and a surrounding portion having a low refractive index, known as the cladding. Within the optical waveguide, light may undergo repeated total reflection at the boundary between the core and cladding, and in this way, an optical waveguide makes it possible to transfer optical signals.

In the case of an optical printed circuit board based on the related art, the core and the cladding may both be made from transparent materials, making it difficult to distinguish the cladding and the core from each, other or to identify the position of the core inserted in the cladding. Thus, when forming circuit patterns, via lands, or solder resist, etc., over the optical waveguide, it may be difficult to align these elements with respect to the core.

SUMMARY

An aspect of the invention is to provide an optical waveguide, an optical printed circuit board having the optical waveguide, and methods of manufacturing the optical waveguide and optical printed circuit board, in which the position of the core can be identified.

One aspect of the invention provides an optical waveguide. The optical waveguide can include: a first cladding layer; a core formed on the first cladding layer; an alignment pattern, having a predefined positional relationship to the core, formed on the first cladding layer; a target mark formed on the alignment pattern such that a position of the alignment pattern is indicated; and a second cladding layer formed on the first cladding layer such that the core, the alignment pattern, and the target mark are covered.

A cavity can be formed in the alignment pattern, and the target mark can be formed in the cavity.

The cavity can be formed in such a way that it is surrounded by the alignment pattern.

The core and the alignment pattern can be made from substantially the same material.

The target mark can be made from an opaque material.

The material used for the target mark can include at least one selected from a group consisting of silver (Ag), copper (Cu), and carbon.

Another aspect of the invention provides a method of manufacturing an optical waveguide. The method can include: forming a core and an alignment pattern, which may have a predefined positional relationship to the core, on a first cladding layer; forming a target mark on the alignment pattern such that a position of the alignment pattern is indicated; and forming a second cladding layer on the first cladding layer in such a way that covers the core, the alignment pattern, and the target mark.

A cavity can be formed in the alignment pattern, and the target mark can be formed in the cavity.

The cavity can be formed in such a way that it is surrounded by the alignment pattern.

The operation of forming the target mark may include filling a fluid substance in the cavity.

The core and the alignment pattern can be made from substantially the same material, and the core and the alignment pattern can be formed simultaneously by a unified process.

Still another aspect of the invention provides an optical printed circuit board. The optical printed circuit board can include: a first cladding layer; a core formed on the first cladding layer; an alignment pattern, having a predefined positional relationship to the core, formed on the first cladding layer; a target mark formed on the alignment pattern such that a position of the alignment pattern is indicated; a second cladding layer formed on the first cladding layer such that the core, the alignment pattern, and the target mark are covered; and a circuit pattern formed on the second cladding layer such that the circuit pattern is aligned with the core by way of the target mark.

A cavity can be formed in the alignment pattern, and the target mark can be formed in the cavity.

The cavity can be formed in such a way that it is surrounded by the alignment pattern.

The core and the alignment pattern can be made from substantially the same material.

The target mark can be made from an opaque material.

The material used for the target mark can include at least one selected from a group consisting of silver, copper, and carbon.

Yet another aspect of the invention provides a method of manufacturing an optical printed circuit board. The method can include: forming a core and an alignment pattern, which may have a predefined positional relationship to the core, on a first cladding layer; forming a target mark on the alignment pattern such that a position of the alignment pattern is indicated; forming a second cladding layer on the first cladding layer in such a way that covers the core, the alignment pattern, and the target mark; and forming a circuit pattern on the second cladding layer such that the circuit pattern is aligned with the core by way of the target mark.

A cavity can be formed in the alignment pattern, and the target mark can be formed in the cavity.

The cavity can be formed in such a way that it is surrounded by the alignment pattern.

The operation of forming the target mark may include filling a fluid substance in the cavity.

The core and the alignment pattern can be made from substantially the same material, and the core and the alignment pattern can be formed simultaneously by a unified process.

Additional aspects and advantages of the present invention will be set forth in part in the description which follows, and in part will be obvious from the description, or may be learned by practice of the invention.

DETAILED DESCRIPTION

Figure 1:
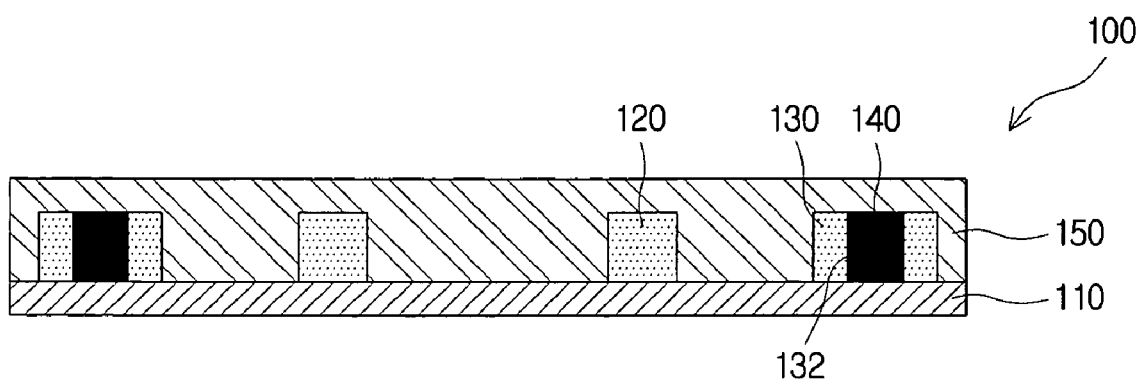
FIG. 1 is a cross sectional view illustrating an embodiment of an optical waveguide according to an aspect of the invention.

Certain embodiments of the invention will be described below in more detail with reference to the accompanying drawings. Those elements that are the same or are in correspondence are rendered the same reference numeral regardless of the figure number, and redundant explanations are omitted.

Such terms as "first" and "second," etc., merely serve to distinguish one element from another. Elements that are the same or are in corresponding relationships are not to be limited by the terms such as "first" and "second," etc.

A description will first be provided on an embodiment of an optical waveguide according to an aspect of the invention.

Figure 2:
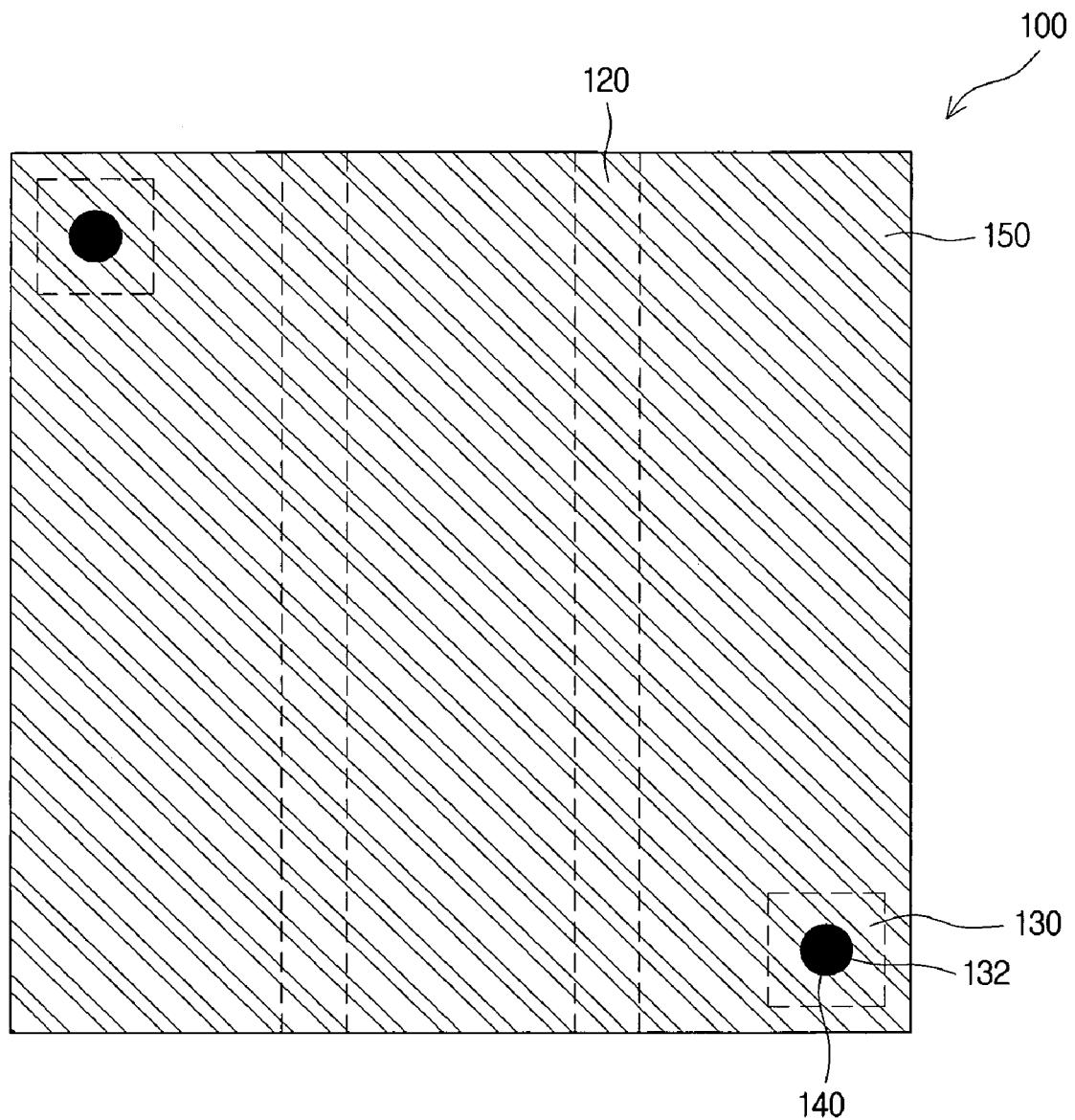
FIG. 2 is a plan view illustrating an embodiment of an optical waveguide according to an aspect of the invention.

FIG. 1 is a cross sectional view illustrating an embodiment of an optical waveguide according to an aspect of the invention, and FIG. 2 is a plan view illustrating an embodiment of an optical waveguide according to an aspect of the invention.

An optical waveguide 100 is presented that can include: a first cladding layer 110, a core 120 formed on the first cladding layer 110, an alignment pattern 130 formed on the first cladding layer 110 in a predefined positional relationship to the core 120, target marks 140 formed on the alignment pattern 130 to indicate the position of the alignment pattern 130, and a second cladding layer 150 formed on the first cladding layer 110 to cover the core 120, alignment pattern 130, and target marks 140. With this optical waveguide 100, the position of the core 120 can be identified, so that the circuit patterns, etc., formed over the second cladding layer 150 can be aligned with the core 120 in a precise and efficient manner.

The core 120 can be formed on the first cladding layer 110 and can be made from a material having a higher refractive index than that of the first cladding layer 110 and the second cladding layer 150 described later. An optical signal transferred inside the core 120 may undergo total reflection at the first cladding layer 110 and at the second cladding layer 150, to be transmitted through the core 120.

The alignment pattern 130 can be formed on the first cladding layer 110 with a predefined positional relationship to the core 120. That is, there may be a particular gap between the alignment pattern 130 and the core 120, and thus, as the position of the alignment pattern 130 may be indicated by the target mark 140 described later, the position of the core 120 may be identified accordingly.

Also, the alignment pattern 130 can be formed simultaneously with the core 120, during the process for forming the core 120, where the alignment pattern 130 can be made from substantially the same material as that of the core 120, and the core 120 and the alignment pattern 130 can be given a positional relationship defined during the design stages.

For example, in the case of forming the core 120 by photolithography, the designing and fabricating of a mask to have a pattern corresponding to the core 120 can additionally include patterning the mask in correspondence to the alignment pattern 130, at a particular distance from the pattern for the core 120, so as to form the alignment pattern 130 that maintains the positional relationship to the core 120 given during the design stages.

Also, in the case of forming the core 120 by imprinting, the stamper can be patterned in correspondence to both the core 120 and the alignment pattern 130, so as to form the alignment pattern 130 with a predefined positional relationship to the core 120.

Even if the positional relationship of the core 120 and alignment pattern 130 is altered by heat or pressure, etc., occurring during the course of the relevant processes, the positional relationship may be altered in a measurable proportion, so that the position of the core 120 may still be identified as described above using the target marks 140.

Cavities 132 can be formed in the alignment pattern 130, and the target marks 140 described later can be formed inside such cavities 132, so that the target marks 140 may be formed with higher precision and greater ease without the need of a separate process for matching the positions of the target marks 140 and the alignment pattern 130.

In other words, the cavities 132 can be formed surrounded by the alignment pattern 130, and the alignment pattern 130 can be shaped as a dam for each of the cavities 132. Thus, by simply filling the insides of the cavities 132 with a fluid substance, the target marks 140 may readily be formed.

Here, the cavities 132 can be patterned on the mask or stamper, etc., for forming the alignment pattern 130, to be formed at the same time as the forming of the alignment pattern 130, and thus the cavities 132 can also be given a predefined positional relationship to the core 120.

The target marks 140 can be formed on the alignment pattern 130 to indicate the position of the alignment pattern 130. Using the target marks 140, the position of the alignment pattern 130 can be identified, and since the position of the core 120 with respect to the alignment pattern 130 may be defined beforehand at the design stages, as described above, the position of the core 120 may readily be identified from the target marks 140. As a result, any circuit pattern, via land, or solder resist, etc., to be formed over the second cladding layer 150 may be aligned with respect to the core 120 in a precise and easy manner.

That is, the target marks 140 can be formed by filling an opaque material made of materials such as silver (Ag), copper (Cu), and carbon, or of a combination of two or more of such materials, inside the cavities 132. The target marks 140 may then be clearly distinguished from the surrounding first cladding layer 110 and second cladding layer 150 made from transparent materials, to be readily identified using electromagnetic waves, such as visible rays, infrared rays, and X-rays, etc.

The second cladding layer 150 can be formed on the first cladding layer 110 in a position covering the core 120, alignment pattern 130, and target marks 140, so as to form an optical waveguide 100 that includes a core 120, an alignment pattern 130, and target marks 140 inset within.

Next, a description will be provided on a method of manufacturing an optical waveguide according to another aspect of the invention.

Figure 3:
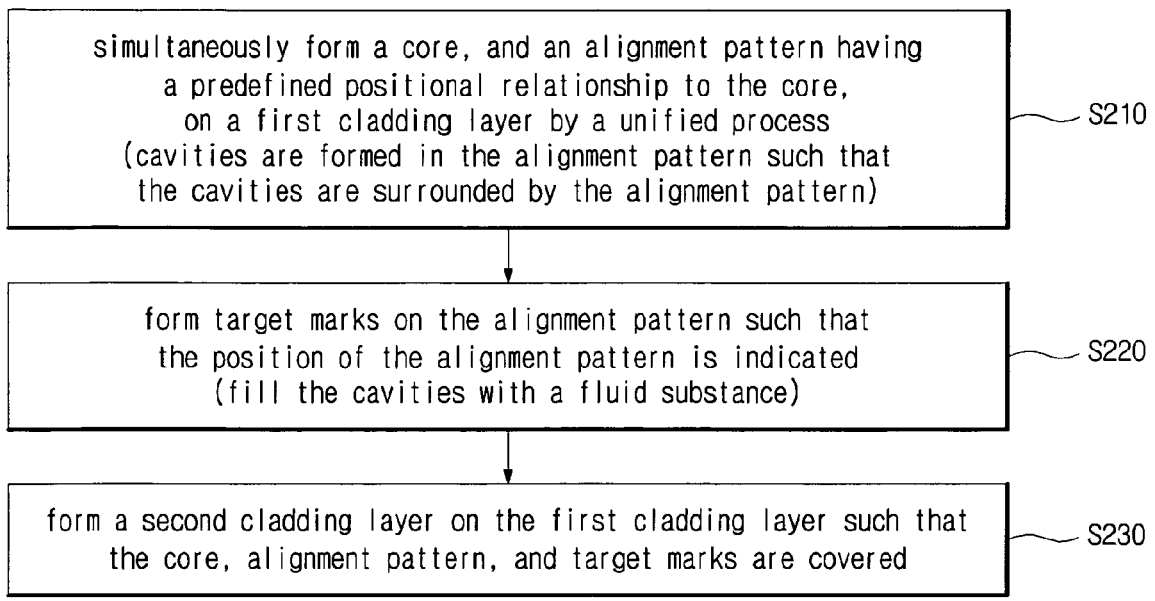
FIG. 3 is a flowchart illustrating an embodiment of a method of manufacturing an optical waveguide according to another aspect of the invention.
Figure 8:
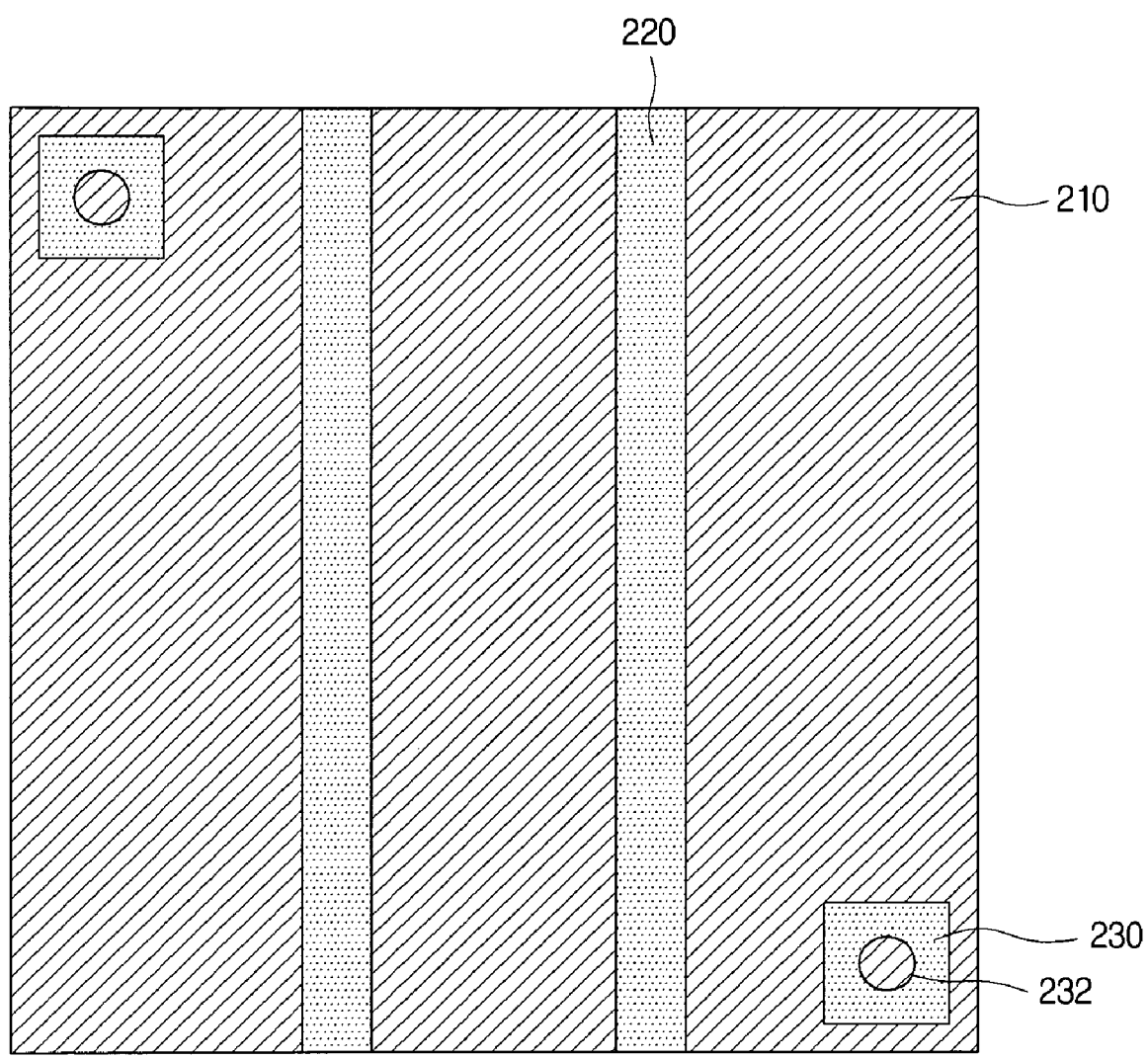
FIG. 8, FIG. 9, and FIG. 10 are plan views each illustrating a process in an embodiment of a method of manufacturing an optical waveguide according to another aspect of the invention.
Figure 9:
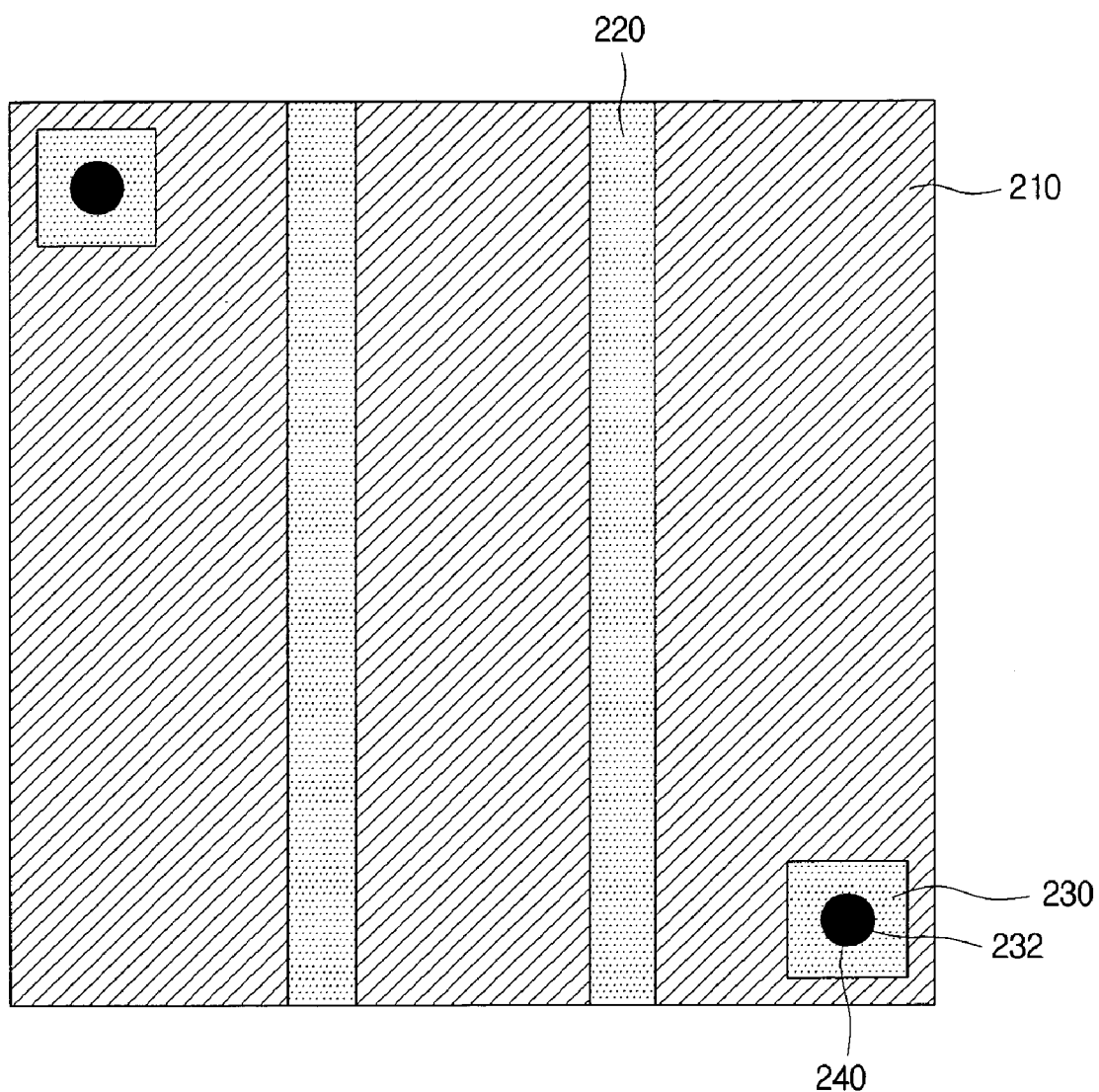
Figure 10:
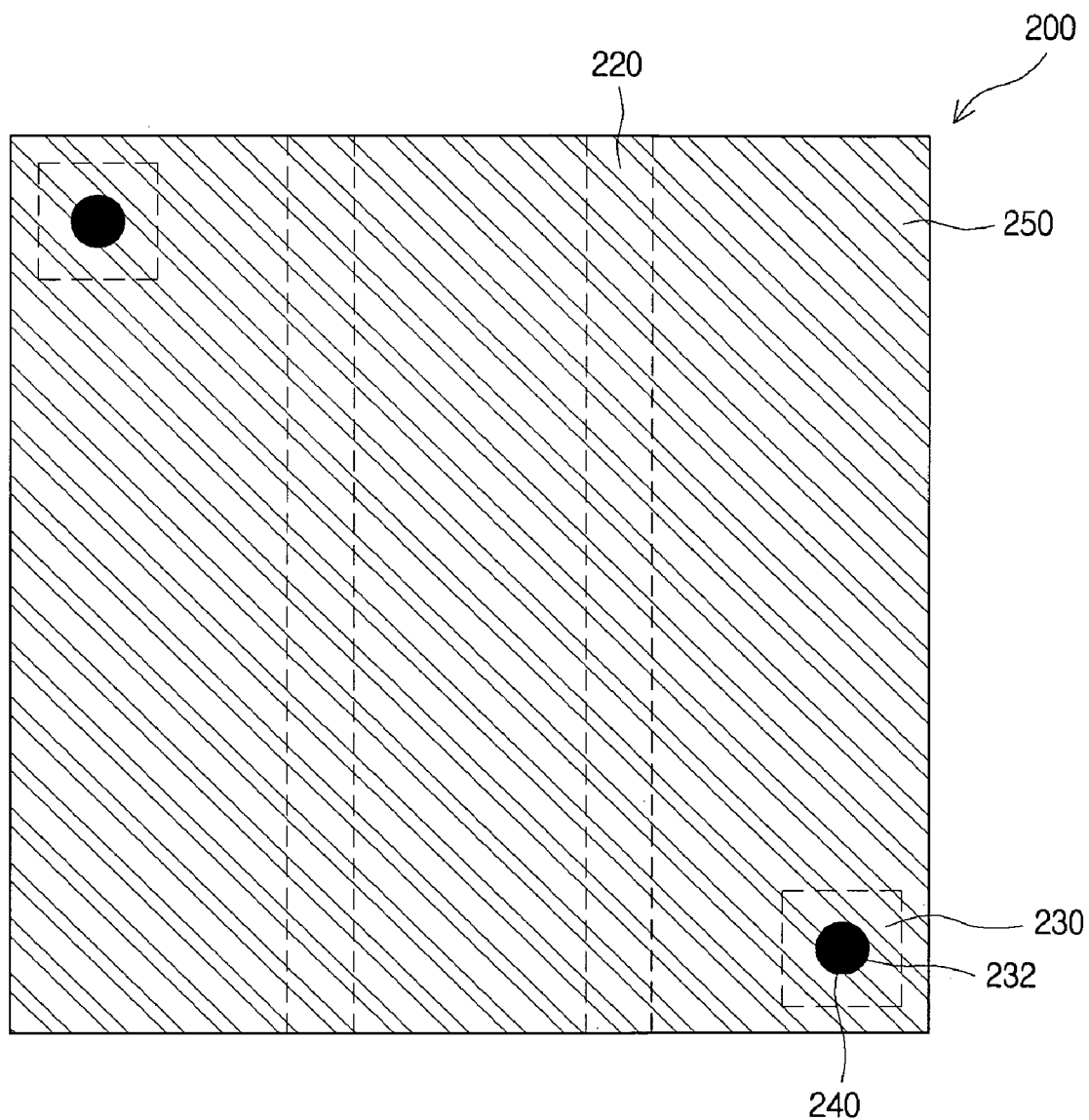

FIG. 3 is a flowchart illustrating an embodiment of a method of manufacturing an optical waveguide according to another aspect of the invention. FIG. 4 through FIG. 7 are cross sectional views each illustrating a process in an embodiment of a method of manufacturing an optical waveguide according to another aspect of the invention. FIG. 8 through FIG. 10 are plan views each illustrating a process in an embodiment of a method of manufacturing an optical waveguide according to another aspect of the invention.

This embodiment presents a method of manufacturing an optical waveguide 200 that can include: forming a core 220 and an alignment pattern 230 that has a predefined positional relationship to the core 220 on a first cladding layer 210, forming target marks 240 on the alignment pattern 230 to indicate the position of the alignment pattern 230, and forming a second cladding layer 250 on the first cladding layer 210 to cover the core 220, the alignment pattern 230, and the target marks 240. Using this method, the position of the core 220 can be identified, to allow precise and efficient alignment of the circuit patterns, etc., which may be formed over the second cladding layer 250, with respect to the core 220.

Figure 4:
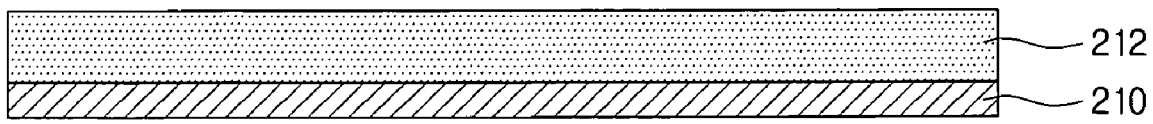
FIG. 4, FIG. 5, FIG. 6, and FIG. 7 are cross sectional views each illustrating a process in an embodiment of a method of manufacturing an optical waveguide according to another aspect of the invention.
Figure 5:
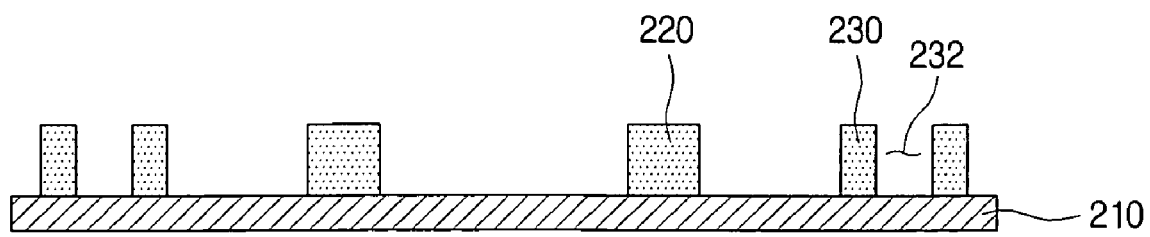

First, as illustrated in FIG. 4, FIG. 5, and FIG. 8, a core 220 and an alignment pattern 230 having a predefined positional relationship to the core 220 can be formed simultaneously on a first cladding layer 210 by a unified process (S210). This particular embodiment will be described for an example in which a core layer 212 may be formed on the first cladding layer 210, as illustrated in FIG. 4, and portions of the core layer 212 may be removed by photolithography processes, to form the core 220 and the alignment pattern 230 from the same material.

That is, in forming an etching resist for etching the core layer 212, the mask can be designed and fabricated to correspond with the core 220 as well as the alignment pattern 230, which may be separated by a particular distance from the core 220. Thus, an etching resist corresponding to the core 220 and the alignment pattern 230 can be formed by photolithography processes. The core layer 212 can be etched in areas other than those where the etching resist is formed, whereby the core 220 and the alignment pattern 230 can be formed which maintain the positional relationship to each other given at the time of design.

Thus, when the position of the alignment pattern 230 is identified using the target marks 240 described later, this can be used to identify the position of the core 220. Even if the positional relationship of the core 220 and alignment pattern 230 is altered by heat or pressure, etc., during the course of the relevant processes, the positional relationship may be altered in a measurable proportion, so that the position of the core 220 may still be identified as described above using the target marks 240.

While this particular embodiment has been described using an example in which photolithography is used, it is apparent that other methods may be used. For example, in the case of forming the core 220 by imprinting, the stamper can be patterned in correspondence to the core 220 and the alignment pattern 230, so as to form the alignment pattern 230 with a predefined positional relationship to the core 220.

Here, cavities 232 can be formed in the alignment pattern 230, and the target marks 240 described later can be formed inside such cavities 232, so that the target marks 240 may be formed with higher precision and greater ease without the need of a separate process for matching the positions of the target marks 240 and the alignment pattern 230.

That is, the cavities 232 can be formed surrounded by the alignment pattern 230, and the alignment pattern 230 can be shaped as a dam for each of the cavities 232, so that the target marks 240 may readily be formed by simply filling the insides of the cavities 232 with a fluid substance.

The cavities 232 can be patterned on the mask or stamper, etc., for forming the alignment pattern 230, to be formed at the same time as the forming of the alignment pattern 230, and thus the cavities 232 can also be given a predefined positional relationship to the core 220.

Figure 6:
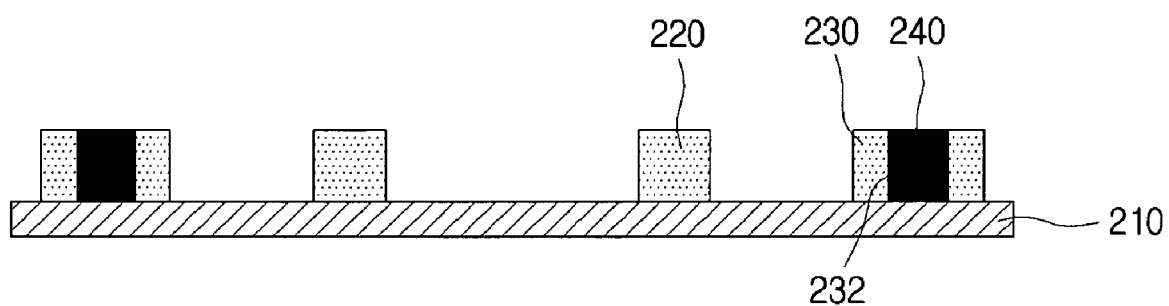

Next, as illustrated in FIG. 6 and FIG. 9, target marks 240 can be formed on the alignment pattern 230 to indicate the position of the alignment pattern 230 (S220). That is, a fluid substance can be filled in the cavities 232 described above to form the target marks 240 in the alignment pattern 230, where the fluid substance can be made from an opaque material, such as silver, copper, and carbon, or a combination of two or more of such materials, to be clearly distinguishable from the surrounding, transparent first cladding layer 210 and second cladding layer 250. Thus, electromagnetic waves such as visible rays, infrared rays, and X-rays, etc., can be utilized to readily identify the positions.

Since the position of the alignment pattern 230 can be identified from the target marks 240, and the position of the core 220 from the alignment pattern 230 may be defined beforehand at the design stages, as described above, the position of the core 220 may readily be identified from the target marks 240. As a result, any circuit pattern, via land, or solder resist, etc., to be formed over the second cladding layer 250 may be aligned with the core 220 in a precise and easy manner.

Figure 7:
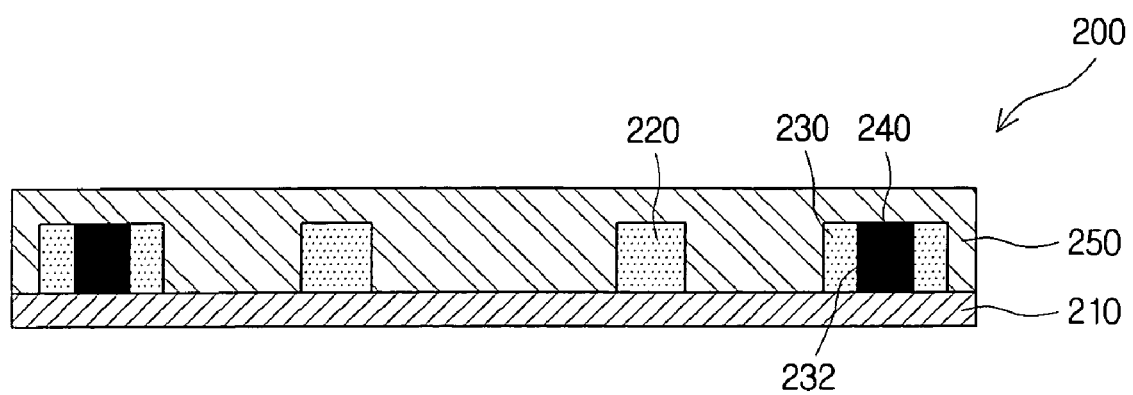

Next, as illustrated in FIG. 7 and FIG. 10, the second cladding layer 250 can be formed on the first cladding layer 210 such that the core 220, the alignment pattern 230, and the target marks 240 are covered (S230). The second cladding layer 250 can be formed on the first cladding layer 210 to cover the core 220, alignment pattern 230, and target marks 240, so that an optical waveguide 200 may be formed that includes a core 220, an alignment pattern 230, and target marks 240 inserted within.

Next, a description will be provided on an optical printed circuit according to still another aspect of the invention.

Figure 11:
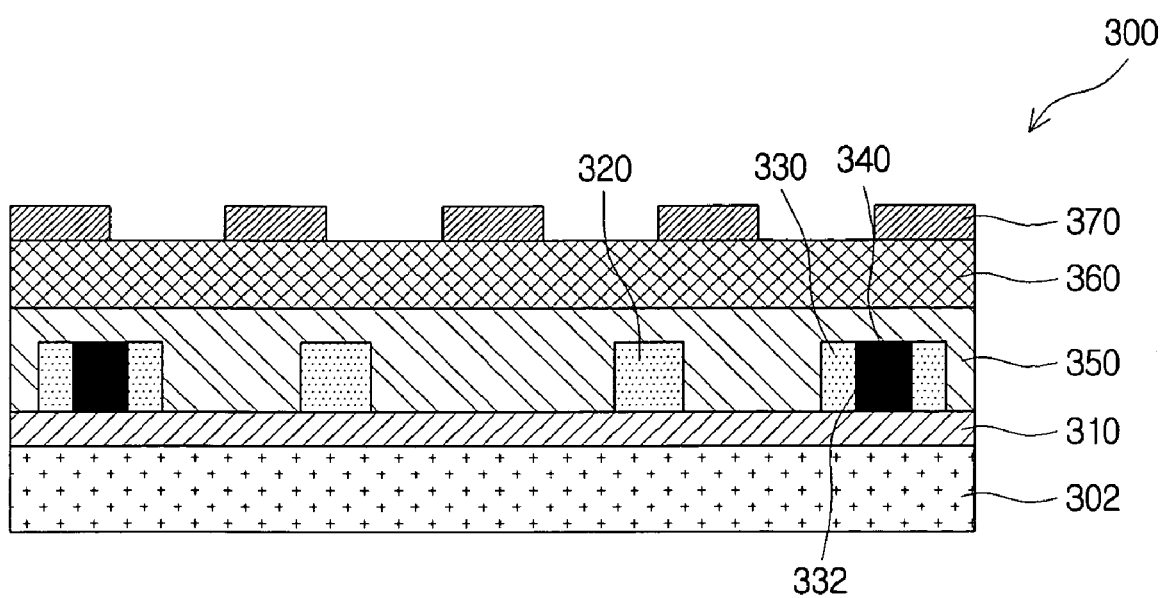
FIG. 11 is a cross sectional view illustrating an embodiment of an optical printed circuit board according to still another aspect of the invention.

FIG. 11 is a cross sectional view illustrating an embodiment of an optical printed circuit board according to still another aspect of the invention.

This embodiment presents an optical printed circuit board 300 that can include: a first cladding layer 310, a core 320 formed on the first cladding layer 310, an alignment pattern 330 formed on the first cladding layer 310 in a predefined positional relationship to the core 320, target marks 340 formed on the alignment pattern 330 to indicate the position of the alignment pattern 330, a second cladding layer 350 formed on the first cladding layer 310 so as to cover the core 320, alignment pattern 330, and target marks 340, and a circuit pattern 370 formed on the second cladding layer 350 aligned with the core 320 by the target marks 340. This optical printed circuit board 300 can provide improved efficiency in optically connecting to optical components or optical fibers.

In this embodiment, the first cladding layer 310, core 320, alignment pattern 330 having cavities 332, target marks 340, and second cladding layer 350 may be substantially the same as or may be in correspondence with elements of the optical waveguide in the embodiment described above. As such, the following descriptions will focus more on the difference from the embodiment described above for the optical waveguide, such as the circuit pattern 370.

The circuit pattern 370 can be formed on the second cladding layer 350 aligned with the core 320 by way of the target marks 340. That is, since the position of the core 320 can be identified by the target marks 340, the circuit pattern 370 can be formed in alignment with the core 320.

As the circuit pattern 370 may thus be formed in alignment with respect to the core 320, the optical connection efficiency may be improved between the core 320 and optical components electrically connected with the circuit pattern 370.

Also, since the position of the core 320 can precisely be identified by the target marks 340, optical fibers may be installed with greater accuracy in correspondence to the position of the core 320, so that the optical connection efficiency may be improved between the core 320 and the optical fibers.

The first cladding layer 310 can be formed on a base substrate 302, and an insulation layer 360 can be placed between the second cladding layer 350 and the circuit pattern 370. In such cases also, the positions of the target marks 340 may be identified accurately using X-rays, etc., to align the circuit pattern 370 and the core 320 with precision.

Next, a description will be provided on a method of manufacturing an optical printed circuit board according to yet another aspect of the invention.

Figure 12:
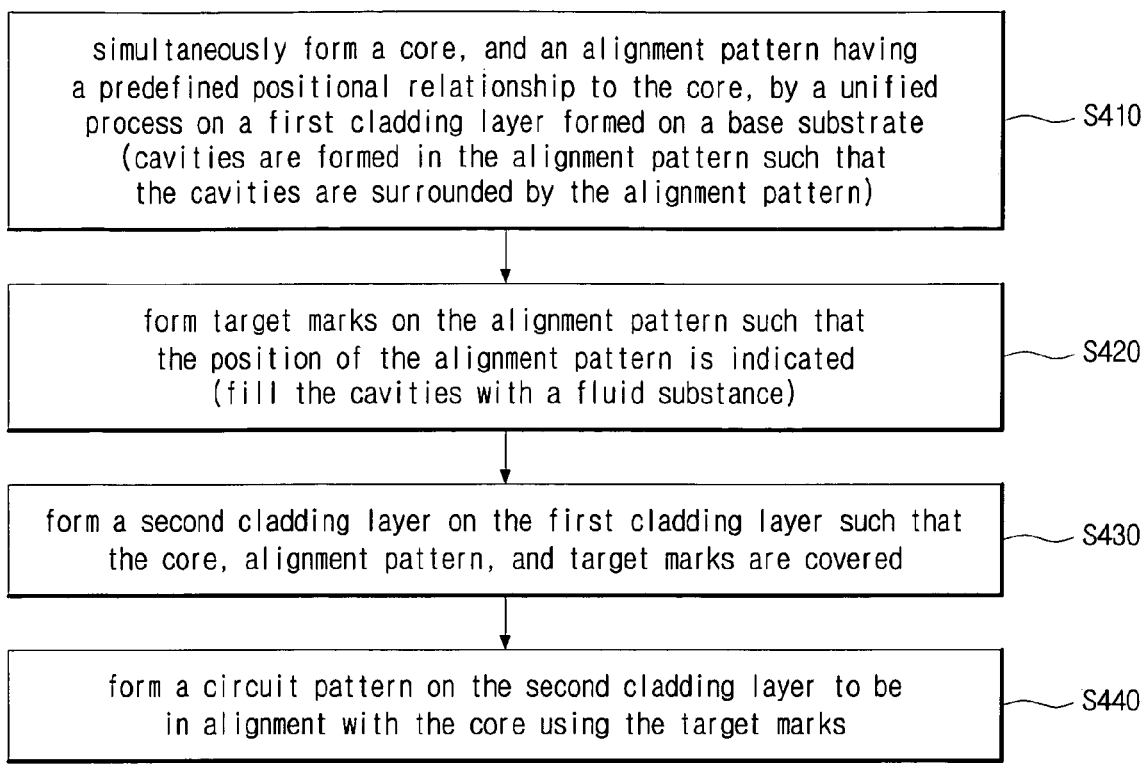
FIG. 12 is a flowchart illustrating an embodiment of a method of manufacturing an optical printed circuit board according to yet another aspect of the invention.

FIG. 12 is a flowchart illustrating an embodiment of a method of manufacturing an optical printed circuit board according to yet another aspect of the invention. FIG. 13 through FIG. 18 are cross sectional views each illustrating a process in an embodiment of a method of manufacturing an optical printed circuit board according to yet another aspect of the invention.

Figure 13:
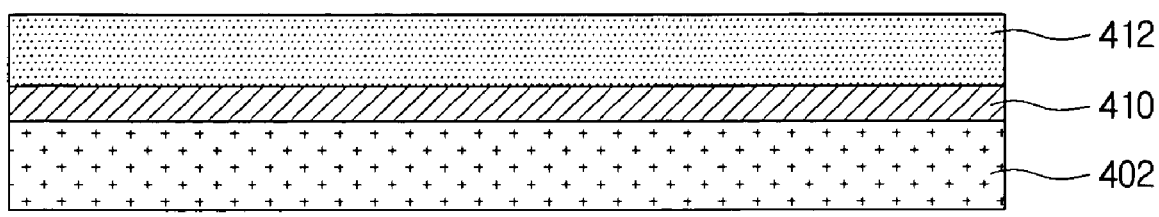
FIG. 13, FIG. 14, FIG. 15, FIG. 16, FIG. 17, and FIG. 18 are cross sectional views each illustrating a process in an embodiment of a method of manufacturing an optical printed circuit board according to yet another aspect of the invention.
Figure 14:
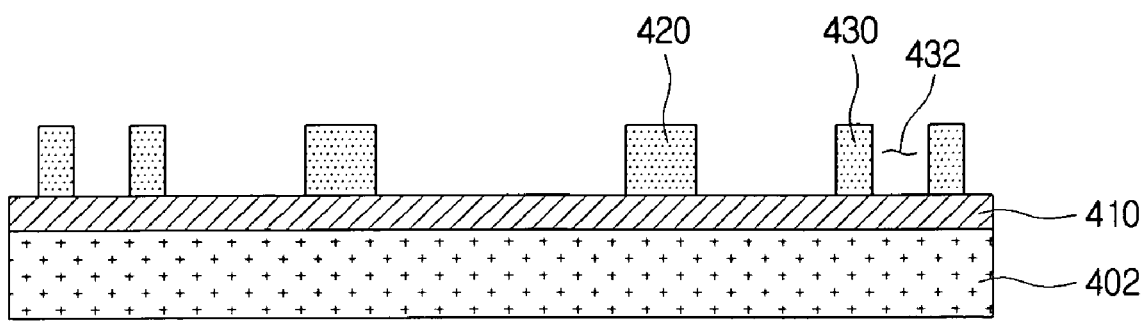
Figure 15:
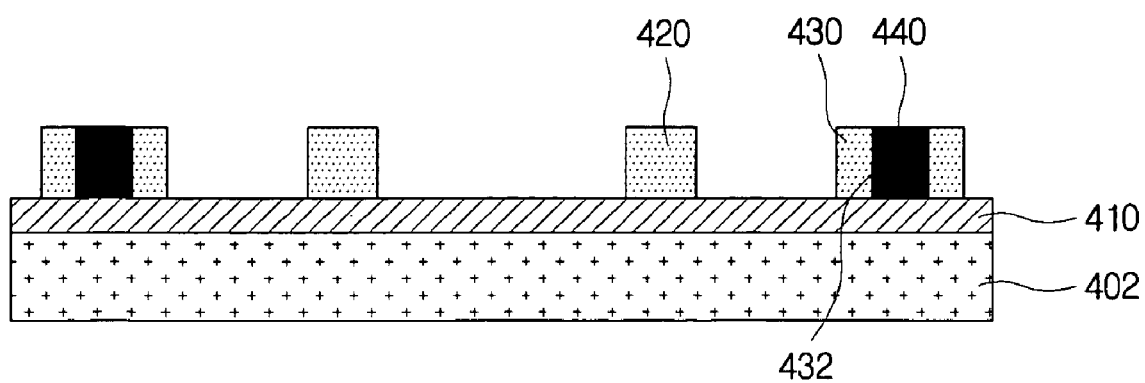
Figure 16:
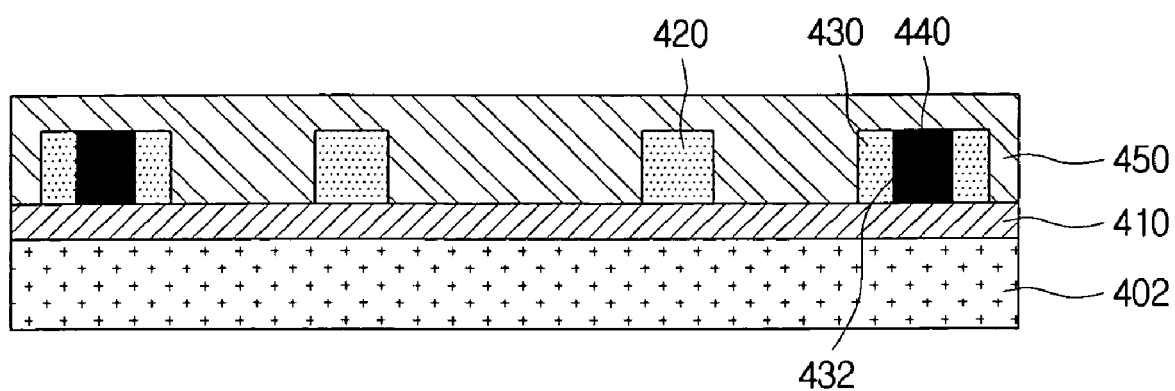
Figure 17:
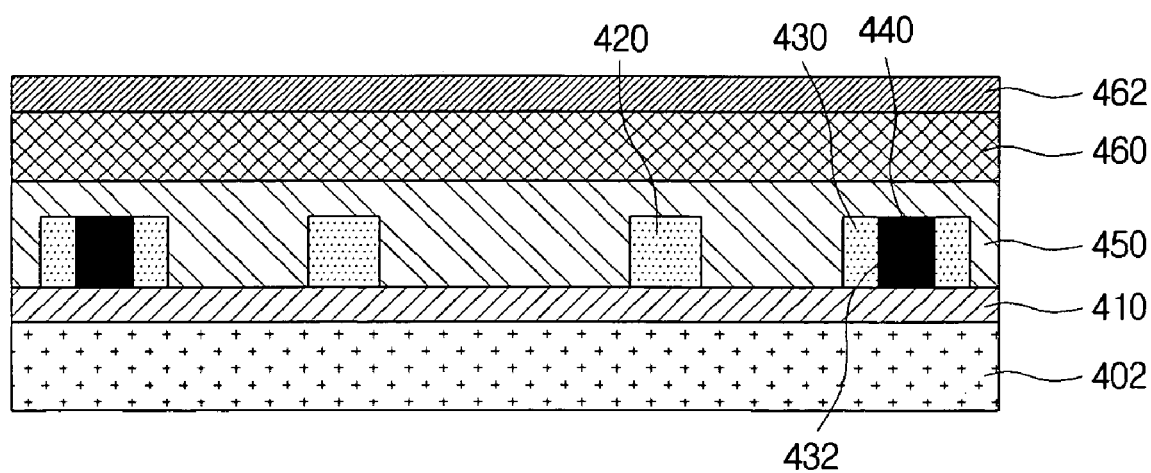
Figure 18:
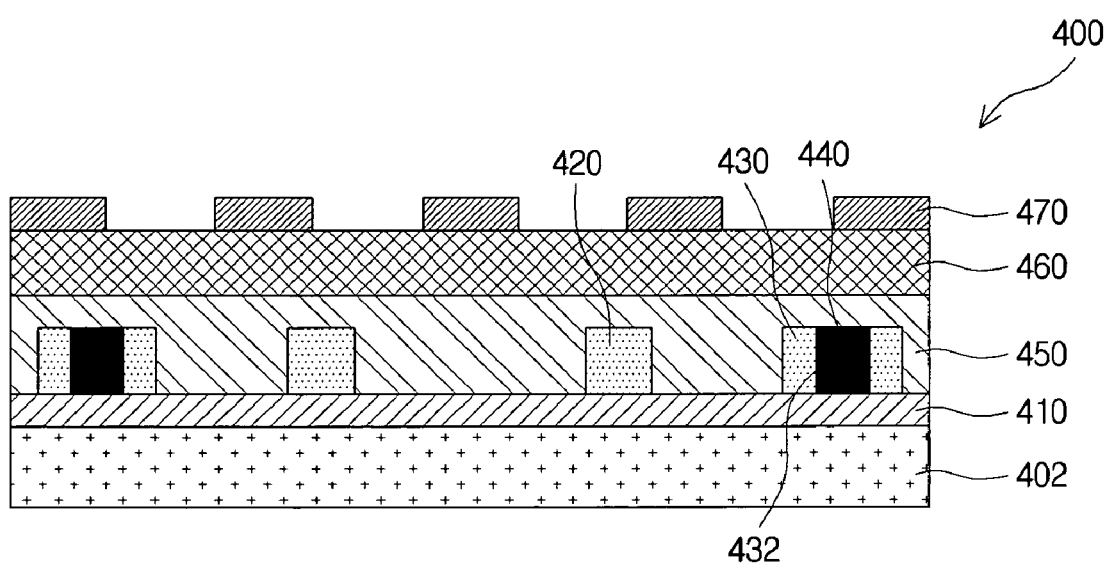

This embodiment presents a method of manufacturing an optical printed circuit board 400 that can include: forming a core 420 and an alignment pattern 430 that has a predefined positional relationship to the core 420 on a first cladding layer 410 that is formed on a base substrate 402 (S410), as illustrated in FIG. 13 and FIG. 14, forming target marks 440 on the alignment pattern 430 to indicate the position of the alignment pattern 430 (S420), as illustrated in FIG. 15, forming a second cladding layer 450 on the first cladding layer 410 to cover the core 420, alignment pattern 430, and target marks 440 (S430), as illustrated in FIG. 16, and forming a circuit pattern 470 on the second cladding layer 450 in alignment with respect to the core 420 by way of the target marks 440 (S440), as illustrated in FIG. 17 and FIG. 18. Using this method, the optical connection efficiency to optical components or optical fibers can be improved.

In this embodiment, the process for forming the core 420 and the alignment pattern 430 having cavities 432 (S410) by forming a core layer 412 on the first cladding layer 410 and removing portions of the core layer 412, the process for forming the target marks 440 (S420), and the process for forming the second cladding layer (S430) may be substantially the same as or may be in correspondence with processes for the method of manufacturing an optical waveguide in the embodiment described above. As such, the following descriptions will focus more on the difference from the embodiment described above for the method of manufacturing an optical waveguide, such as the process for forming a circuit pattern 470 (S440).

As illustrated in FIGS. 17 and 18, a circuit pattern 470 can be formed on the second cladding layer 450 to be aligned with the core 420 by way of the target marks 440. The circuit pattern 470 may be formed by forming a conductive layer 462 over the second cladding layer 450 and etching portions of the conductive layer 462.

Since the position of the core 420 can be identified using the target marks 440, the circuit pattern 470 can be formed aligned with the core 420, whereby the optical connection efficiency may be improved between the core 420 and optical components electrically connected with the circuit pattern 470.

Also, since the position of the core 420 can precisely be identified using the target marks 440, optical fibers may be installed in correspondence to the position of the core 420 with greater accuracy, so that the optical connection efficiency may be improved between the core 420 and the optical fibers.

As illustrated in FIG. 13, the first cladding layer 410 can be formed on a base substrate 402, and an insulation layer 460 can be placed between the second cladding layer 450 and the circuit pattern 470. In such cases also, the positions of the target marks 440 may be identified accurately using X-rays, etc., to precisely align the circuit pattern 470 with respect to the core 420.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. An optical waveguide comprising:
   a first cladding layer;
   a core formed on the first cladding layer;
   an alignment pattern formed on the first cladding layer, the alignment pattern having a predefined positional relationship to the core;
   a target mark formed on the alignment pattern such that a position of the alignment pattern is indicated; and
   a second cladding layer formed on the first cladding layer such that the core, the alignment pattern, and the target mark are covered.

2. The optical waveguide of claim 1, wherein the alignment pattern comprises a cavity formed therein, and
   the target mark is formed in the cavity.

3. The optical waveguide of claim 2, wherein the cavity is surrounded by the alignment pattern.

4. The optical waveguide of claim 1, wherein the core and the alignment pattern are made from a same material.

5. The optical waveguide of claim 1, wherein the target mark is made from an opaque material.

6. The optical waveguide of claim 5, wherein the target mark is made from a material including at least one selected from a group consisting of silver (Ag), copper (Cu), and carbon.

7. A method of manufacturing an optical waveguide, the method comprising:

forming a core and an alignment pattern on a first cladding layer, the alignment pattern having a predefined positional relationship to the core;

forming a target mark on the alignment pattern such that a position of the alignment pattern is indicated; and forming a second cladding layer on the first cladding layer such that the core, the alignment pattern, and the target mark are covered.

8. The method of claim 7, wherein a cavity is formed in the alignment pattern, and the target mark is formed in the cavity.

9. The method of claim 8, wherein the cavity is surrounded by the alignment pattern.

10. The method of claim 9, wherein forming the target mark comprises:

filling a fluid substance in the cavity.

11. The method of claim 7, wherein the core and the alignment pattern are made from a same material, and the core and the alignment pattern are formed simultaneously by a unified process.

12. An optical printed circuit board comprising:

a first cladding layer;

a core formed on the first cladding layer;

an alignment pattern formed on the first cladding layer, the alignment pattern having a predefined positional relationship to the core;

a target mark formed on the alignment pattern such that a position of the alignment pattern is indicated;

a second cladding layer formed on the first cladding layer such that the core, the alignment pattern, and the target mark are covered; and a circuit pattern formed on the second cladding layer such that the circuit pattern is aligned with the core by way of the target mark.

13. The optical printed circuit board of claim 12, wherein the alignment pattern comprises a cavity formed therein, and the target mark is formed in the cavity.

14. The optical printed circuit board of claim 13, wherein the cavity is surrounded by the alignment pattern.

15. The optical printed circuit board of claim 12, wherein the core and the alignment pattern are made from a same material.

16. The optical printed circuit board of claim 12, wherein the target mark is made from an opaque material.

17. The optical printed circuit board of claim 16, wherein the target mark is made from a material including at least one selected from a group consisting of silver, copper, and carbon.

18. A method of manufacturing an optical printed circuit board, the method comprising:

forming a core and an alignment pattern on a first cladding layer, the alignment pattern having a predefined positional relationship to the core;

forming a target mark on the alignment pattern such that a position of the alignment pattern is indicated;

forming a second cladding layer on the first cladding layer such that the core, the alignment pattern, and the target mark are covered; and forming a circuit pattern on the second cladding layer such that the circuit pattern is aligned with the core by way of the target mark.

19. The method of claim 18, wherein a cavity is formed in the alignment pattern, and the target mark is formed in the cavity.

20. The method of claim 19, wherein the cavity is surrounded by the alignment pattern.

21. The method of claim 20, wherein forming the target mark comprises:

filling a fluid substance in the cavity.

22. The method of claim 18, wherein the core and the alignment pattern are made from a same material, and the core and the alignment pattern are formed simultaneously by a unified process.

* * * * *